United States Patent [19]

Fujioka et al.

[11] Patent Number: 5,426,016
[45] Date of Patent: Jun. 20, 1995

[54] METHOD OF FORMING AND REMOVING RESIST PATTERN

[75] Inventors: Hirofumi Fujioka; Yasuhiro Yoshida; Hiroyuki Nakajima, all of Amagasaki; Hitoshi Nagata; Shinji Kishimura, both of Itami, all of Japan

[73] Assignee: Mitsubishi Denki Kabushiki Kaisha, Tokyo, Japan

[21] Appl. No.: 87,100

[22] Filed: Jul. 7, 1993

Related U.S. Application Data

[62] Division of Ser. No. 667,986, Mar. 12, 1991, Pat. No. 5,252,433.

[30] Foreign Application Priority Data

| | | | |
|---|---|---|---|
| Mar. 19, 1990 | [JP] | Japan | 2-70495 |
| Mar. 19, 1990 | [JP] | Japan | 2-70498 |
| May 16, 1990 | [JP] | Japan | 2-124217 |
| Nov. 21, 1990 | [JP] | Japan | 2-318332 |

[51] Int. Cl.$^6$ .............................................. G03C 5/00
[52] U.S. Cl. ..................................... 430/323; 430/313; 430/317; 430/325; 430/329; 216/66; 216/48
[58] Field of Search ............... 430/311, 313, 314, 315, 430/317, 318, 323, 325, 329; 156/628, 643, 656, 659.1, 662, 904

[56] References Cited

U.S. PATENT DOCUMENTS

| | | | |
|---|---|---|---|
| 4,405,710 | 9/1983 | Balasubramanyam | 430/312 |
| 4,454,221 | 6/1984 | Chen | 430/317 |
| 4,761,464 | 8/1988 | Zeigler | 430/326 |
| 4,935,094 | 6/1990 | Mixon | 430/296 |
| 4,944,893 | 7/1990 | Tanaka | 252/171 |

*Primary Examiner*—Kathleen Duda
*Attorney, Agent, or Firm*—Lowe, Price, LeBlanc & Becker

[57] ABSTRACT

The present invention is directed to a method of forming and removing a resist pattern, used in a semiconductor manufacture.

In a first mode of the present invention, an upper resist layer containing germanium is selectively formed on a bottom resist layer and a resist pattern is formed with the upper resist layer as a mask. In a second mode of the present invention, a resist layer formed on a substrate is selectively exposed to introduce a germanium compound into the exposed portions and the above described resist layer is subjected to an anisotropic dry etching to remove the nonexposed portions of the resist layer, whereby forming a resist pattern. Accordingly, the fine pattern can be formed on the substrate in high accuracy by the use of the above described resist pattern. In addition, in the first and the second modes of the present invention, the resist pattern is removed by the use of an acid having an oxidizing power, so that the resist pattern can be easily removed from the substrate.

9 Claims, No Drawings

METHOD OF FORMING AND REMOVING RESIST PATTERN

This application is a Divisional application of application Ser. No. 07/667,986, filed Mar. 12, 1991, now U.S. Pat. No. 5,252,433.

BACKGROUND OF THE INVENTION

1. Field of the Invention

The present invention relates to a method of forming and removing a resist pattern used when a fine pattern of submicron level is formed on a substrate such as a silicon wafer and is utilized in a manufacturing process of for example a super-LSI, a high-speed transistor, a magnetic bubble memory and the like.

2. Description of Background Arts

It has been recently desired with a remarkable improvement of a semiconductor element and the like in integration degree to form a fine pattern of submicron level in high accuracy. However, the semiconductor element has a multi-layer structure and an unevenness, which can not be disregarded in a lithographic process, appears on a surface of a substrate. Such the unevenness leads to an increase of a thickness of a resist layer for flattening, an irregular reflection of exposing light and the like, and thus a resolution of resist is reduced. Accordingly, it is difficult to conduct a fine processing of high resolution by the conventional method using the above described single-layer resist.

In order to solve the above described problems, a two-layer resist method has been proposed. In the bi-layer resist method, a usual photoresist and the like is formed on a substrate for flattening and then photosensitive resist layer superior in oxygen dry etching-resistance is formed on the bottom layer followed by exposing and developing to form the upper photosensitive resist layer pattern. Subsequently, the bottom layer pattern is etched by oxygen dry etching using the patterned photosensitive resist layer as a mask to form a resist pattern.

Various kinds of photosensitive resist composed of organo silicon polymers have been investigated for the photosensitive upper resist layer used in this method (refer to for example Nikkei New Material. Aug. 3, 1987, pp.40–70).

These photosensitive resists all utilize a matter that the silicon atoms in the organo silicon polymers are turned into $SiO_2$ during the oxygen dry etching to form a layer having the resistance against the oxygen dry etching. According to this method, an unevenness on the substrate can be flattened by a bottom resist layer and the upper resist layer is reduced in thickness and uniformed, so that the upper resist layer can be developed in high accuracy by means of a developer. Thus, when the bottom resist layer is etched by an oxygen dry etching using the upper layer as the mask, a pattern of the upper resist layer can be transferred to the bottom resist layer in high accuracy. Accordingly, a fine pattern can be formed on the substrate in high accuracy by the use of the above described resist pattern.

However, since the upper resist layer is made of the organo silicon polymers, a surface layer is changed to $SiO_2$ by the oxygen dry etching to be insoluble to a usual resist-removing liquid. Consequently, when it is intended to remove the resist pattern by means of the removing liquid after forming the fine pattern on the substrate, the upper resist layer is not dissolved to leave leftovers on the substrate.

In addition, if the resist pattern is removed by the use of hydrogen flouride and the like, in which $SiO_2$ is soluble, the substrate is damaged.

On the other hand, a DESIRE process, which will be below described, has been known as a method of fomring a resist pattern in high accuracy removely from the above described bi-layer resist method.

That is to say, a resist layer is fomred on an uneven surface of a substrate by the use of novolac resin/naphtoquinone diazide family photoresists and then the resist layer is selectively exposed. Subsequently, hexamethyl-disilazane gas is reacted with the selectively exposed resist layer with heating to introduce trimethylsilyl groups merely into the exposed area, whereby forming a silylated layer. Then, a resist pattern is formed by dry etching by the $O_2RIE$ method using the silylated layer as a mask.

This method has been called the DESIRE process and disclosed in Solid State Technology., No. 6 (1987), pp.93 to 99.

In this method, naphthoquinone diazide in the resist layer is turned into indene carboxylic acid by exposing, whereby the exposed area becomes hydrophilic and thus hexamethylsilazane is apt to enter the resist layer. As a result, hexamethylsilazane reacts with —OH groups and —COOH groups in the resist layer to form groups such as —OSi $(CH_3)_3$ and —COOSi $(CH_3)_3$. In addition, since the nonexposed area is hydrophobic and cross-linked by heating when silylated, hexamethylsilazane is not diffused into the resist layer and thus not silylated. The resist pattern is formed by an anisotropic oxygen dry etching using such the selectively and accurately silylated layer as a mask. That is to say, the fine pattern having a high aspect ratio can be formed.

However, since the resist pattern is formed by the oxygen dry etching using the silylated layer as the mask in the DESIRE process, the surface portion of the resist layer is turned into $SiO_2$ to be insoluble and unmeltable. Accordingly, a problem occurs in that it is difficult to remove the resist layer after etching in the same manner as in the above described bi-layer resist method.

SUMMARY OF THE INVENTION

The present invention is directed to a method of forming and removing a resist pattern.

A method of forming and removing resist pattern according to the present invention includes a method on the basis of the bi-layer resist method and a method on the basis of the DESIRE process.

The method on the basis of a bi-layer resist method comprises a step of forming a bottom resist layer on a substrate; a step of selectively forming a upper resist layer containing germanium on the bottom resist layer; a step of etching the bottom resist layer by an anisotropic oxygen dry etching using the upper resist layer as a mask to form a resist pattern; and a step of removing the resist pattern by the use of an acid having an oxidizing power.

In addition, the method on the basis of a DESIRE process comprises a step of forming a resist layer on a substrate; a step of selectively exposing the resist layer to introduce a germanium compound into the exposed area; a step of etching the resist layer by an anisotropic oxygen dry etching to remove the nonexposed portions of the resist layer, whereby forming a resist pattern; and a step of removing the resist pattern by the use of an acid having an oxidizing power.

Accordingly, it is a main object of the present invention to provide a method of forming and removing a resist pattern capable of forming the resist pattern having a high transfer accuracy to a substrate and easily removing the resist pattern from the substrate.

According to a first mode of the present invention utilizing the bi-layer resist method, the upper resist layer containing germanium is selectively formed on the bottom resist layer and the bottom resist layer is etched by the anisotropic oxygen dry etching using the upper resist layer as the mask to form the resist pattern.

In addition, according to a second mode of the present invention utilizing the DESIRE process, the resist layer formed on the substrate is selectively exposed to light to introduce the germanium compound into the exposed area and the above described resist layer is subjected to the anisotropic dry etching to remove the nonexposed area of the resist layer, whereby forming the resist pattern.

Accordingly, the fine pattern can be formed on the substrate in high accuracy by the use of the above described resist pattern. In addition, in these first and second modes of the present invention, the resist pattern is removed by the use of the acid having an oxidizing power, so that the resist pattern can be easily removed from the substrate.

DESCRIPTION OF THE PREFERRED EMBODIMENTS

The present invention relates to a method of forming and removing a resist pattern used when a fine pattern is formed on a substrate such as a semiconductor substrate. The present invention includes a method on the basis of a bi-layer resist method, as set forth in claims 1 to 9, and a method on the basis of a DESIRE process, as set forth in claims 10 to 13.

Of the preferred embodiments which will be below described, in the first to fourth preferred embodiments the method on basis of a bi-layer resist method is described and in the fifth and sixth preferred embodiments the method on the basis of a DESIRE process is described.

A. First Preferred Embodiment

At first, in the first preferred embodiment, the embodiment relating to the method set forth in claims 1 to 3 is described.

This method comprises a step of forming a bottom resist layer on a substrate; a step of selectively forming a upper resist layer on the bottom resist layer; a step of etching the bottom resist layer by an anisotropic oxygen dry etching using the upper resist layer as a mask to form a resist pattern; and a step of removing the resist pattern by the use of an acid having an oxidizing power.

A bottom resist layer of the bi-layer resist layer is made of a usual resist such as a novolac resin/naphthoquinone diazide photoresist.

In addition, an upper resist of the bi-layer resist is formed of a negative-type resist mainly comprising an alkali-soluble organic germanium polymer and a bisazide compound.

Every alkali-soluble polymer containing Ge atoms in a molecule can be used as the alkali-soluble organic germanium polymer. For exmaple, alkali-soluble organic polymers which are chemically bonded with $-(CH_2)_m GeR_3$ groups (R is an organic group such as an alkyl group having 1 to 6 carbon atoms, a benzen ring, a benzen ring substituting an alkyl group having 1 to 6 carbon atoms, and the like; m is an integer of 0 or more), polygermoxane having an alkali-soluble organic group in a side chain and the like can be used.

In addition, the bisazide compound includes a compound expressed by the following general formula (A-1) and the like.

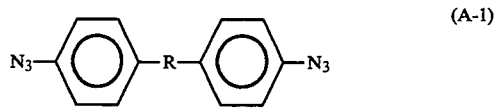

(A-1)

where in R is an organic group selected from the group consisting of $-CH_2-$, $-C(CH_3)_2-$, $-C(CF_3)_2-$, $-SO_2-$ and the like.

All of resist meterals composed of these compounds are cross-linked by irradiating them with a high-energy beam to be made insoluble to a developer, whereby giving a negative-type resist pattern.

In addition, an alkaline aqueous solution, such as an aqueous solution of tetramethylammonium hydroxide, is used as the developer.

A strong acid whereof pH value is 2 or less is preferably used as the acid having an oxydizing power. For example peroxo acids, such as peroxosulfuric acid, peroxonitric acid and peroxophophoric acid; oxo acids such as perchloric acid; chloric acid and hypochlorous acid; hot concentrated sulfuric acid; fuming nitric acid; and the like can be used as the acid having an oxidizing power. Of these acids, in particular peroxosulfuric acid or fuming nitric acid is preferably used in view of a solubility of the resist layer.

In addition, in the case where the resist layer is merely removed, permanganic acid, chromic acid and the like can be used but these contain heavy metals and thus have a bad influence upon the semiconductor element, so that the use thereof is not desirable.

Furthermore, an ashing treatment by a usual oxygen plasma may be conducted before or after removing the resist layer by the use of the acid having an oxidizing power.

EXPERIMENTAL EXAMPLES 1 to 8 based on the above described first preferred embodiment will be below described.

In addition, in the following EXPERIMENTAL EXAMPLES, a forming treatment, a developing treatment and a removing treatment of the upper resist layer of the bi-layer resist layer according to the bi-layer resist layer are described.

(A-1) EXPERIMENTAL EXAMPLES 1 to 8

The bisazide compounds expressed by the following formulae (A-6) and (A-7) were added to the alkali-soluble organic germanium polymers expressed by the following general formulae (A-2), (A-3), (A-4) and (A-5) in quantity of 15% by weight to form photosensitive compositions as a constituent material of the upper resist layer.

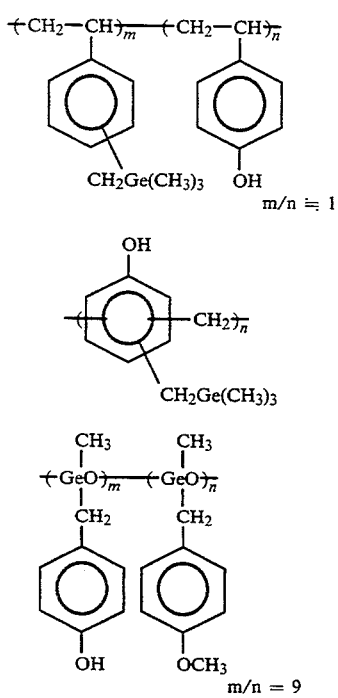

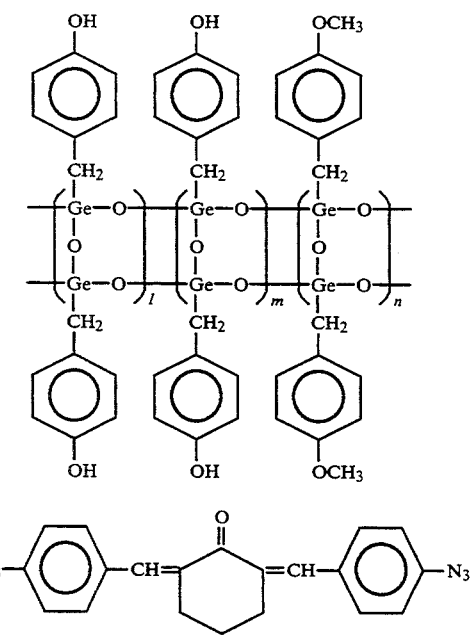

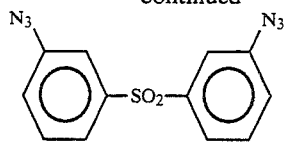

Then, the above described photosensitive compositions were applied to silicon wafers as a substrate in a thickness of about 0.2 μm and prebaked for 20 minutes at 80° C.

Subsequently, an exposure was carried out by the use of a Xe—Hg lamp as a light source (Cold Mirror, LM250). In this time, Jet light made by Oak Co. Ltd. in the case where the bisazide (A-6) was used and Maskaligner PLA-521 (made by Canon Inc.) in the case where the bisazide (A-7) was used. After the exposure, the developments were carried out with an alkaline aqueous solution (Microposit 2401 made by Shipley KK) as the developer, and an irradiation dose, at which a thickness of the remaining upper resist layer arrived at ½ times the initial layer-thickness, was adopted as a sensitivity. The resolution was determined from a minimum pattern size which could be resolved by a line and space pattern. The sensitivity and resolution in the respective cases are shown in the following Table A1.

TABLE A1

| Item | | Experimental Examples | | | | | | | |
|---|---|---|---|---|---|---|---|---|---|
| | | 1 | 2 | 3 | 4 | 5 | 6 | 7 | 8 |
| Photosensitive Resin Composition | Alkali-soluble Germanium polymer | A-2 | A-2 | A-3 | A-3 | A-4 | A-4 | A-5 | A-5 |
| | Sensitizer | A-6 | A-7 | A-6 | A-7 | A-6 | A-7 | A-6 | A-7 |
| Sensitivity (mJ/cm$^2$) | | 90 | 100 | 100 | 150 | 90 | 100 | 95 | 110 |
| Resolution (μm) | | 0.5 | 0.5 | 0.5 | 0.5 | 0.5 | 0.5 | 0.5 | 0.4 |
| Etching Speed (nm/min) | | 4.0 | 4.0 | 3.0 | 3.0 | 2.5 | 2.5 | 2.0 | 2.0 |

Next, in order to remove the pattern of the upper resist layer formed in the above described EXPERIMENTAL EXAMPLE 1, the silicon wafer was immersed in peroxosulfuric acid, peroxophosphoric acid and hypochlorous acid, respectively with the result that the resist layer was perfectly dissolved and no leftover was found.

In addition, the pattern of the upper resist layer formed in EXPERIMENTAL EXAMPLE 1 was etched in an oxygen plasma ashing apparatus for 20 minutes followed by immersing in peroxosulfuric acid for 2 minutes with the result that the resist layer was perfectly dissolved and no leftover was found.

As obvious from the above described EXPERIMENTAL EXAMPLES, the upper resist layer could be patterned in a high resolution. Accordingly, in the case where the upper resist layer is formed on the bottom resist layer to be patterned in the same manner as in the above described respective EXPERIMENTAL EXAMPLES, followed by etching the bottom resist layer with the pattern of the upper resist layer as the mask, the pattern of the upper resist layer can be transferred onto the bottom resist layer is high accuracy and thus the resist pattern can be formed in high accuracy. As a result, the fine pattern can be formed on the substrate by the use of the above described resist pattern in high accuracy.

Furthermore, since the upper resist layer can be easily removed from the substrate, both the bottom resist layer and the upper resist layer can be easily removed even though the bottom resist layer is formed under the upper resist layer.

B. Second Preferred Embodiment

In the second preferred embodiment, the embodiment relating to the method as set forth in claims 1, 2 and 4 is described.

As set forth in claim 4, an upper resist layer of the bi-layer resist layer is composed of an organic germanium polymer having polymerizable groups in a molecule and a polymerization initiator.

Organic germanium polymers containing vinyl groups and epoxy groups in a molecule can be used as the organic germanium polymer having polymerizable groups in a molecule.

In addition, as the polymerization initiator of these polymerizable groups, the above described bisazide compounds (A-1), (A-6), (A-7), derivatives of benzophenone, benzoin, thioxanthone and the like and the like are used for radical polymerizable groups such as acryloyl group, methacryloyl group and allyl group. Furthermore, onium salts expressed by the following general formulae (B-1), (B 2) are used as the polymerization initiator of the cationic polymerizable groups.

(B-1)

(B-2)

All of resist materials composed of these compounds are cross-linked by irradiating them with a high-energy beam to be made insoluble to a developer, whereby giving a negative-type resist pattern in the same manner as in the above described first preferred embodiment. In addition, a mixture of a solvent, to which the organic germanium compound is easily soluble, and a solvent, to which the organic germanium compound is poorly soluble, and the like are used as the developer.

Other constructions are same as in the above described first preferred embodiment.

EXPERIMENTAL EXAMPLES 9 to 16 conducted on the basis of the above described second preferred embodiment will be below described.

Also in these EXPERIMENTAL EXAMPLES, attention was paid to the upper resist layer of the bi-layer resist layer in the same manner as in the above described EXPERIMENTAL EXAMPLES based on the first preferred embodiment.

(B-I) EXPERIMENTAL EXAMPLES 9 to 12

The bisazide compounds (A-6) and (A-7) were added to the organic germanium polymers having a radical polymerizable group expressed by the following formulae (B-3) and (B-4) in a quantity of 5% by weight to obtain photosensitive compositions for the upper resist layer.

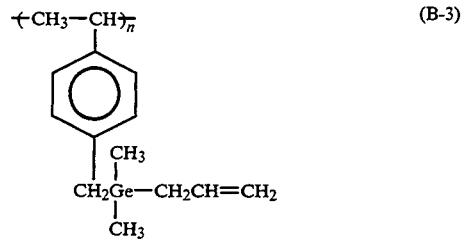

(B-3)

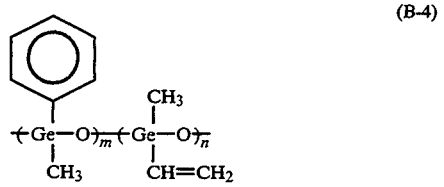

(B-4)

And, the evaluation was conducted in the same manner as in the above described respective EXPERIMENTAL EXAMPLES of the first preferred embodiment. In this case, xylene was used as the developer. The results are shown in the following Table B1.

TABLE B1

| Item | | Experimental Examples | | | |
| --- | --- | --- | --- | --- | --- |
| | | 9 | 10 | 11 | 12 |
| Photosensitive Resin Composition | Germanium Polymer | B-3 | B-3 | B-4 | B-4 |
| | Sensitizer | A-6 | A-7 | A-6 | A-7 |
| Sensitivity (mJ/cm$^2$) | | 70 | 50 | 75 | 60 |
| Resolution ($\mu$m) | | 0.6 | 0.6 | 0.6 | 0.6 |
| Etching Speed (nm/min) | | 3.0 | 3.0 | 2.5 | 2.5 |

(B-II) EXPERIMENTAL EXAMPLES 13 to 16

The onium salts expressed by the following formulae (B-7) and (B-8) were added to the organic germanium polymers having a cationic polymerizable group expressed by the following formulae (B-5) and (B-6) in a quantity of 5% by weight to obtain photosensitive compositions for the upper resist layer.

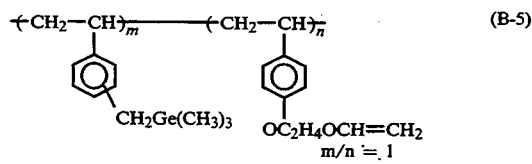

(B-5)

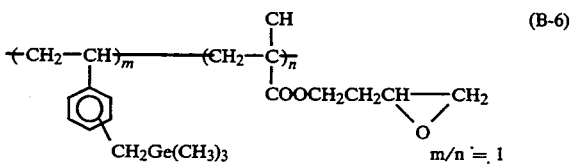

(B-6)

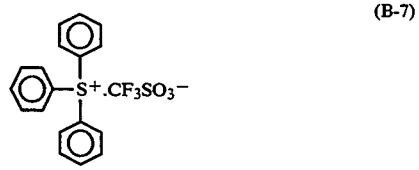

(B-7)

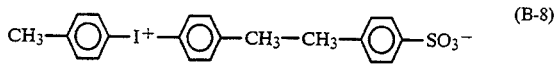

And, the above described photosensitive compositions were applied to silicon wafers and an exposure was carried out by the use of Mask-aligner PLA-251 as a light source. After the exposure, the heat treatment was carried out for 2 minutes at 100° C. followed by developing with xylene to conduct the evaluation in the same manner as in the above description. The results are shown in the following Table B2.

TABLE B2

| Item | | Experimental Examples | | | |
|---|---|---|---|---|---|
| | | 13 | 14 | 15 | 16 |
| Photosensitive Resin Composition | Germanium Polymer Sensitizer | B-5 B-7 | B-5 B-8 | B-6 B-7 | B-6 B-8 |
| Sensitivity (mJ/cm²) | | 20 | 25 | 20 | 25 |
| Resolution (μm) | | 0.6 | 0.6 | 0.6 | 0.6 |
| Etching Speed (nm/min) | | 4.0 | 4.0 | 4.0 | 4.0 |

Next, the patterns of the upper resist layer formed in the above described EXPERIMENTAL EXAMPLES 9, 13 were immersed in peroxosulfuric acid, peroxophosphoric acid and hypochlorous acid, respectively, for 5 minutes with the result that the resist layer was perfectly dissolved and no leftover was found.

In addition, the patterns of the upper resist layer used in EXPERIMENTAL EXAMPLES 9, 13 were etched in an oxygen plasma ashing apparatus for 20 minutes followed by immersing in peroxosulfuric acid for 2 minutes with the result that the resist layer was perfectly dissolved and no leftover was found.

As obvious from the above described EXPERIMENTAL EXAMPLES, the upper resist layer could be patterned in a high resolution. Accordingly, in the case where the upper resist layer is formed on the bottom resist layer to be patterned in the same manner as in the above described respective EXPERIMENTAL EXAMPLES, followed by etching the bottom resist layer with the pattern of the upper resist layer as the mask, the pattern of the upper resist layer can be transferred onto the bottom resist layer in high accuracy and thus the resist pattern can be formed in high accuracy. As a result, the fine pattern can be formed on the substrate by the use of the above described resist pattern in high accuracy.

Furthermore, since the upper resist layer can be easily removed from the substrate both the bottom resist layer and the upper resist layer can be easily removed even though the bottom resist layer is formed under the upper resist layer.

C. Third Preferred Embodiment

In this third preferred embodiment, a method relating to claims, 1, 2 and 5, a method relating to claims 1, 2 and 6, a method relating to claims 1, 2 and 7 and a method relating to claims 1, 2 and 8 are described.

In these methods, the upper resist layer of the bi-layer resist layer is formed from a positive-type resist.

The positive-type resist includes;

a resist system (1) using an alkali-soluble germanium polymer and a photosensitive dissolution-inhibiting agent, as set forth in claim 5;

a resist system (2) using an alkali-soluble organic germanium compound, an alkali-soluble organic polymer and a photosensitive dissolution-inhibiting agent, as set forth in claim 6;

a resist system (3) using an alkali-soluble germanium polymer, a dissolution-inhibiting agent which is decomposed by an acid catalyst to be turned into an alkali-soluble substance, and a photosensitive acid-generating agent, as set forth in claim 7, and a resist system (4) using an organic germanium polymer which is decomposed by an acid catalyst to be turned into an alkali-soluble substance, and a photosensitive acid-generating agent,a s set forth in claim 8.

Alkali-soluble organic germanium polymers similar to those described in the above described first preferred embodiment are used as the alkali-soluble organic germanium polymer.

Every organic germanium polymer containing an organic group, which is decomposed by an acid catalyst to be turned into an alkali-soluble group, and a Ge atom in a molecule is used as the organic germanium polymer which is decomposed by an acid catalyst to be turned into an alkali-soluble substance. For example, polymers expressed by the following general formulae (C-1), (C-2), (C-3) and the like can be used.

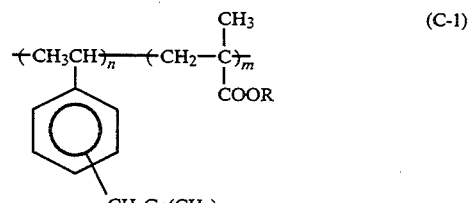

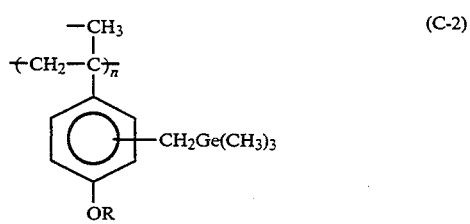

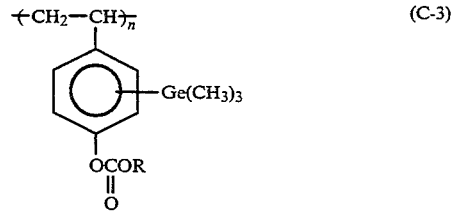

wherein R is an organic group selected from the group consisting of

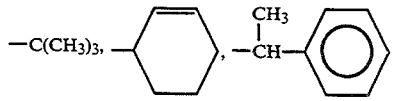

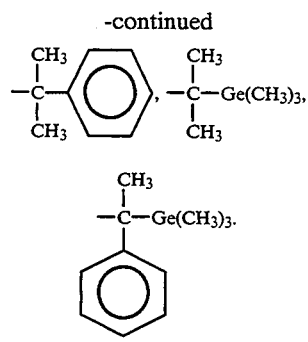

Ortho-naphthoquinonediazide compound expressed by the following general formula (C-4), o-nitrobenzyl ester compound expressed by the following general formula (C-5), nitrophenyldihydropyridine compound expressed by the following general formula (C-6), diazomerdramic acid expressed by the following general formula (C-7) and the like are used as the photosensitive dissolution-inhibiting agent.

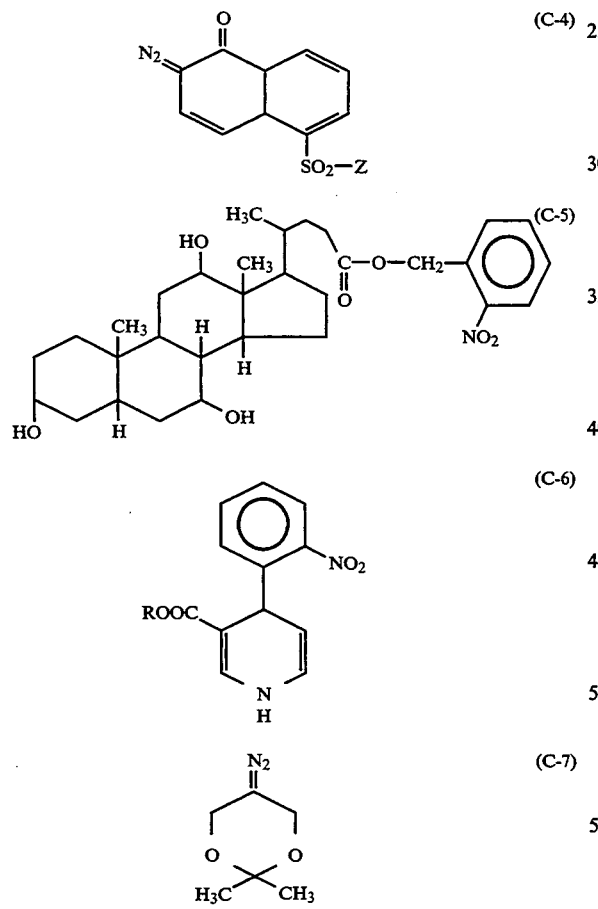

wherein R is an organic group such as alkyl group having 1 to 6 carbon atoms, a benzen ring, a benzen ring substituting an alkyl group having 1 to 6 carbon atoms, and the like; Z is an organic group such as compound having phenolic hydroxyl group before bonding with naphthoquinondiazide, and the like.

Acetals, ethers and ester compounds are used as the dissolution-inhibiting agent which is decomposed by an acid catalyst to be turned into an alkali-soluble substance. Concretely, they are expressed by the following formulae (C-8) to (C-13).

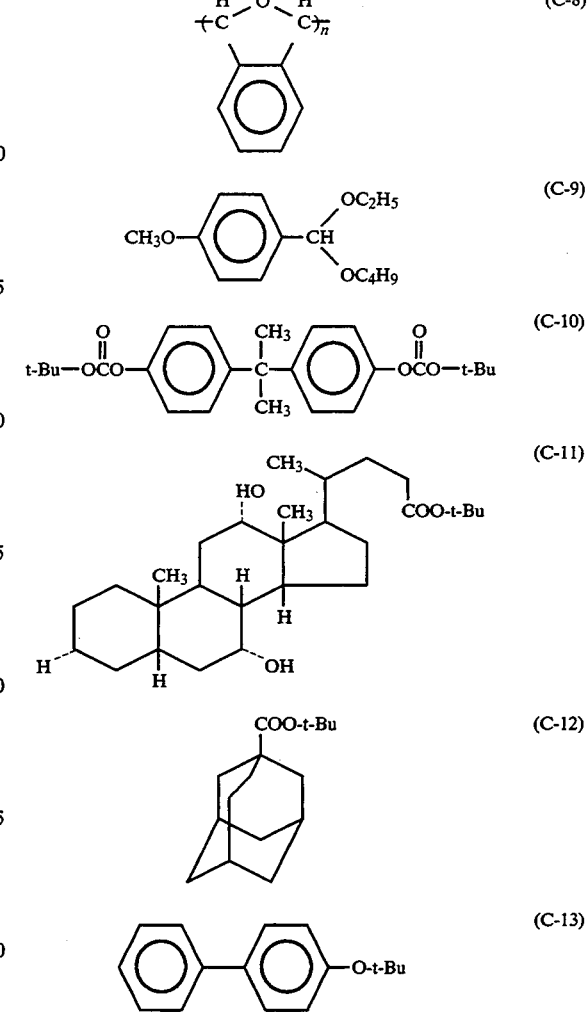

Sulfonium salt expressed by the following general formula (C-14), iodonium salt expressed by the following general formula (C-15), chlorine compound expressed by the following general formula (C-16), diazonium salt expressed by the following general formula (C-17) and the like are used as the photosensitive acid-generating agent capable of generating a strong acid when irradiated with high-energy beams.

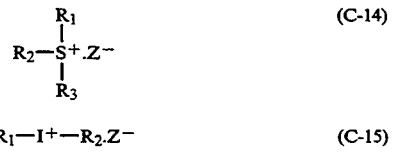

$$R_1\text{—}I^+\text{—}R_2.Z^-  \quad (C\text{-}15)$$

$$Cl_3C\text{—}R \quad (C\text{-}16)$$

$$R_1\text{—}N_2^+.X^- \quad (C\text{-}17)$$

Novolac resin, cresol-novolac resin, polyvinyl phenol and the like are used as the alkali-soluble organic polymer.

In addition, it is preferable that the above described photosensitive dissolution-inhibiting agent and dissolution-inhibiting agent, which is decomposed by an acid catalyst to be turned into an alkali-soluble substrate, are added in a quantity of 5 to 30% by weight. In this case, if they are added in a quantity of less than 5% by weight, the dissolution-inhibiting effect for an alkaline developer is reduced while if the are added in a quantity of more than 30% by weight, the content of Ge as the resist material is reduced. In addition, in the system, to which the photosensitive acid-generating agent with a reduced oxygen dry etching-resistance is added, it is preferable that they are added in a quantity of 0.1 to 10% by weight. In this case, if they are added in a quantity of less than 0.1%, the generation of acid when irradiated with a light is reduced, that is the catalystic effect is reduced, while if they are added in a quantity of more than 10% by weight, the content of Ge as the resist material is reduced and thus the oxygen dry etching-resistance is reduced.

All of these resist materials increase solubility to an alkaline aqueous solution by exposing and become the positive-type resist by using an alkaline aqueous solution, such as an aqueous solution of tetramethylammonium hydroxide, as the developer.

Other components are same as in the above described first and second preferred embodiments.

The individual EXPERIMENTAL EXAMPLES 1 to 17 of the above described resist systems (1) to (4) will be below described.

(C-1) EXPERIMENTAL EXAMPLES 1 to 8 corresponding to the resist system (1)

A pohotosensitizer expressed by the following formulae (C-18) and (C-19) were added to the alkali-soluble organic germanium polymers expressed by the above described formulae (A-2) to (A-5), respectively, in a quantity of 20% by weight to form photosensitive resin compositions as a constituent material of upper resist layer.

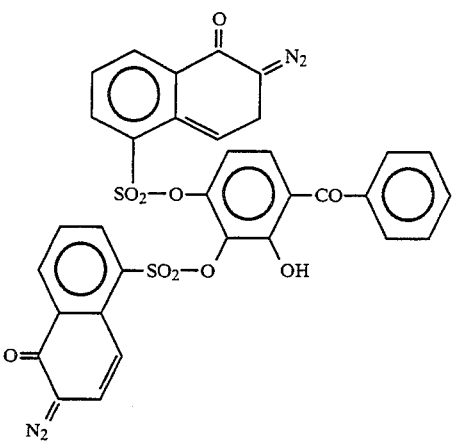

(C-18)

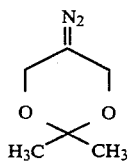

(C-19)

Then, the above described photosensitive compositions were applied to silicon wafers in a thickness of about 0.2 μm and prebaked for 20 minutes at 80° C.

Subsequently, an exposure was carried out by the use of a Xe—HG lamp as a light source (Cold Mirror, LM 250). In this time, Jet Light made by Oak kk in the EXPERIMENTAL EXAMPLE in the case where the pohotosensitive agent (C-18) was used and Mask-aligner PLA-521 (made by Canon kk) in the EXPERIMENTAL EXAMPLE in the case where the pohotosensitive agent (C-19) was used. After the exposure, the development was carried out with an alkaline aqueous solution as a developer comprising Microposit 2401 (made by Shipley KK) and water in a ratio of 1/1, and an irradiation dose, at which a thickness of the remaining upper resist layer arrived at 0, was used as a sensitivity. The resolution was determined from a minimum pattern size which could be resolved by a line and space pattern. The sensitivity and resolution in the respective EXPERIMENTAL EXAMPLES are shown in the following Table C1.

TABLE C1

| Item | | Experimental Examples | | | | | | | |
|---|---|---|---|---|---|---|---|---|---|
| | | 1 | 2 | 3 | 4 | 5 | 6 | 7 | 8 |
| Photosensitive Resin Composition | Alkali-soluble Germanium Polymer | A-2 | A-2 | A-3 | A-3 | A-4 | A-4 | A-5 | A-5 |
| | Sensitizer | C-18 | C-19 | C-18 | C-19 | C-18 | C-19 | C-18 | C-19 |
| Sensitivity (mJ/cm$^2$) | | 90 | 125 | 80 | 200 | 80 | 100 | 85 | 110 |
| Resolution (μm) | | 0.5 | 0.5 | 0.5 | 1.5 | 0.5 | 0.5 | 0.5 | 0.5 |
| Etching Speed* (nm/min) | | 4.0 | 4.0 | 3.0 | 3.0 | 2.5 | 2.5 | 2.0 | 2.0 |

*by the O$_2$ gas plasma (C-II) EXPERIMENTAL EXPAMPLES 9, 10 corresponding to the resist system (2)

The photosensitizers expressed by the above described formulae (C-18) and (c-19) and Maruzen resin M (made by Maruzen Oil and Chemicals Co. Ltd.) as the alkali-soluble organic polymer were added to the alkali-soluble organic germanium compound expressed by the above described general formula (A-2) in a quantity of 20% weight and 5% by weight, respectively, to form photosensitive resin compositions. And, the evaluation of the resulting compositions was conducted in the same manner as in the above described EXPERIMENTAL EXAMPLES 1 to 8. The results are shown in the following Table C2.

TABLE C2

| Item | Experimental Examples | |
|---|---|---|
| | 9 | 10 |
| Sensitizer | C-18 | C-19 |
| Sensitivity (mJ/cm²) | 90 | 125 |
| Resolution (μm) | 0.5 | 0.5 |
| Etching Speed (nm/min) | 4.0 | 4.0 |

(C-III) EXPERIMENTAL EXAMPLES 11 to 13 corresponding to the resist system (3)

The dissolution-inhibiting agents expressed by the following formulae (C-20) to (C-22) and the above described photosensitive acid-generating agent (C-6) were added to the alkali-soluble organic germanium polymer expressed by the above described general formula (A-2) in a quantity of 10% by weight and 2% by weight, respectively, to form photosensitive resin compositions.

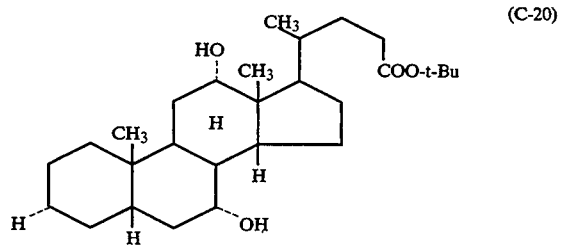
(C-20)

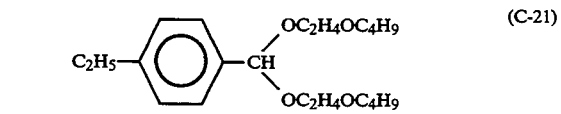
(C-21)

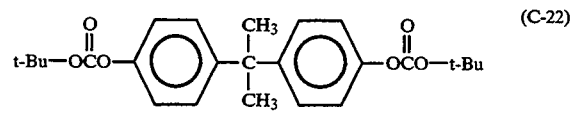
(C-22)

The evaluation of the resulting compositions was conducted in the same manner as in the above described EXPERIMENTAL EXAMPLES 1 to 8. But, in this case, a heat treatment was carried out for 2 minutes at 110° C. between the exposing treatment and the developing treatment. The results are shown in the following Table C3.

TABLE C3

| Item | Experimental Examples | | |
|---|---|---|---|
| | 11 | 12 | 13 |
| Dissolution-inhibiting Agent | C-20 | C-21 | C-22 |
| Sensitivity (mJ/cm²) | 30 | 20 | 20 |
| Resolution (μm) | 0.4 | 0.5 | 0.5 |
| Etching Speed (nm/min) | 3.5 | 3.5 | 3.5 |

(C-IV) EXPERIMENTAL EXAMPLES 14 to 17 corresponding to the resist system (4)

The photosensitive acid-generating agents expressed by the following formulae (C-23) and (C-24) were added to the organic germanium polymers expressed by the above described formulae (B-3) and (B-4) to form photosensitive resin compositions.

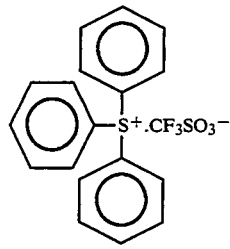
(C-23)

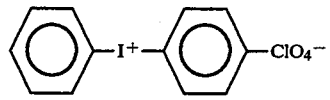
(C-24)

The evaluation of the resulting photosensitive resin compositions was conducted in the same manner as in the above described EXPERIMENTAL EXAMPLES 9 and 10. The results are shown in the following Table C4.

TABLE C4

| Item | Experimental Examples | | | |
|---|---|---|---|---|
| | 14 | 15 | 16 | 17 |
| Organic Germanium Polymer | B-3 | B-4 | B-3 | B-4 |
| Photosensitive Acid-generating Agent | C-23 | C-23 | C-24 | C-24 |
| Sensitivity (mJ/cm²) | 20 | 25 | 30 | 30 |
| Resolution (μm) | 0.4 | 0.4 | 0.4 | 0.4 |
| Etching Speed (nm/min) | 4.0 | 3.0 | 4.0 | 3.0 |

In addition, patterns of the upper resist layers formed in the above described EXPERIMENTAL EXAMPLES 1, 9, 11 and 14 were immersed in peroxosulfuric acid, peroxophosphoric acid, fuming nitric acid and hypochlorous acid for 5 minutes, respectively, with the result that the resist layers were perfectly dissolved and no leftover was found.

Furthermore, the patterns of the upper resist layers used in EXPERIMENTAL EXAMPLES 1, 9, 11 and 14 were etched in an an oxygen plasma ashing apparatus for 20 minutes followed by immersing peroxosulfuric acid and fuming nitric acid for 2 minutes with the result that the resist layers were perfectly dissolved and no leftover was found.

As obvious from the above described EXPERIMENTAL EXAMPLES, the upper resist layer could be patterned in a high resolution. Accordingly, in the case where the upper resist layer is formed on the bottom resist to be patterned in the same manner as in the above described respective EXPERIMENTAL EXAMPLES, followed by etching the bottom resist layer with the pattern of the upper resist layer as the mask, the pattern of the upper resist layer can be transferred onto the bottom resist layer in high accuracy and thus the resist pattern can be formed in high accuracy. As a result, the fine pattern can be formed on the substrate in high accuracy by the use of the above described resist pattern.

Furthermore, since the upper resist layer can be easily removed from the substrate, both the bottom resist layer and the upper resist layer can be easily removed even through the bottom resist layer is formed under the upper resist layer.

D. Fourth Prefered Embodiment

In the fourth preferred embodiment, the embodiment relating to the method as set forth in claims 1, 2 and 9 is described.

As set fourth in claim 9, an upper resist layer of the bi-layer resist layer is mainly composed of a germanium-containing main chain decomposition-type compound.

Organic polygerman, polymethymethacrylate containing germanium in a side chain, polyolefine sulfone and the like are used as the compound. All of these compounds have a structure of a polymer having germanium and an acidic ingredient and are expressed by for example the following general formulae (D-1), (D-2) and (D-3). In this case, the general formula (D-1) expresses organic polygerman, the general formula (D-2) expressing polymethacrylate containing germanium in a side chain, and the general formula (D-3) expressing polyolefine sulfone.

(D-1)

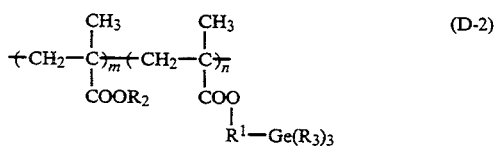
(D-2)

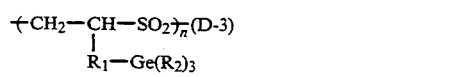
(D-3)

wherein $R_1$ is a divalent organic group such as a methylen group having 1 to 6 carbon atoms, and the like; $R_2$ and $R_3$ are monovalent organic groups such as an alkyl group having 1 to 6 cabon atoms, a benzen ring, a benzen ring substituting an alkyl group having 1 to 6 carbon atoms, and the like; m and n are a positive integer; m/n is a number of 0 or more.

These polymers are irradiated with far ultraviolet rays or electron beams to decompose their main chains, whereby functioning as a positive-type resist. In addition, they are easily dissolved in a removing liquid in the subsequent resist-separating process because they are the main chain decomposition-type polymer.

Other constituents are same as in the above described third prefered embodiment.

EXPERIMENTAL EXAMPLES 1 to 6, in which the resist layer is formed by the use of the above described germanium containing main chain decomposition-type compound, will be below described.

(D-I) EXPERIMENTAL EXAMPLE 1 to 3

In EXPERIMENTAL EXAMPLE 1, a polymer as an upper resist layer expressed by the following formula (D-4) was applied to a silicon wafer as a substrate by the spin coating so that a thickness of the layer might be about 0.5 μm and then exposed with far ultraviolet rays by the use of Mask-aligner PLA-521 (made by Canon Inc.).

(D-4)

In addition, a Xe—Hg lamp (Cold Mirror, LM 250) were used as a light source in the above described Maskaliner.

After the exposure, the development was carried out, and an irradiation dose at which a thickness of the remaining upper resist layer arrvied at 0, was used as a sensitivity. The resolution was determined from a minimum pattern size which could be resolved by a line and space pattern. In addition, a toluene/i-propyl alcohol mixture (1/1) was used as a developer.

Furthermore, in EXPERIMENTAL EXAMPLE 2 and EXPERIMENTAL EXAMPLE 3, polymers expressed by a following formulae (D-5) and (D-6), respectively, were used and a methyl ethyl ketone/i-propyl alcohol mixture (1/9) and an amyl acetate/i-propyl alcohol mixture (1/6) was used as a developer, respectively. The exposure, the development and the measurement of pattern size were carried out in the same manner as in the above described EXPERIMENTAL EXAMPLE 1.

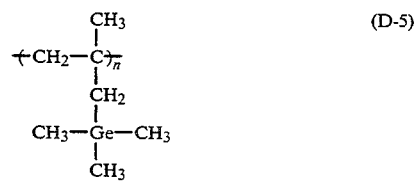
(D-5)

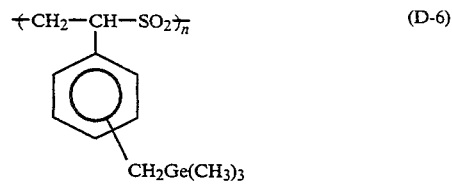
(D-6)

The results are shown in the following Table D1.

TABLE D1

| Item | Experimental Examples | | |
| --- | --- | --- | --- |
| | 1 | 2 | 3 |
| Material | D-4 | D-5 | D-6 |
| Sensitivity (mJ/cm$^2$) | 150 | 300 | 120 |
| Resolution (μm) | 0.4 | 0.5 | 0.5 |
| O$_2$RIE Etching Rate (nm/min) | 1.0 | 2.5 | 3.0 |

As the results of these EXPERIMENTAL EXAMPLES 1 to 3, the sensitivity (mJ/cm$^2$) and the resolution (μm) are shown together with the O$_2$RIE etching rate (nm/min). Here J designates joule.

(D-II) EXPERIMENTAL EXAMPLES 4 to 6

In EXPERIMENTAL EXAMPLES 4 to 6, polymers expressed by the following formulae (D-7), (D-8) and (D-9), respectively, were used to form upper resist layers in the same manner as in the above described EXPERIMENTAL EXAMPLES 1 to 3.

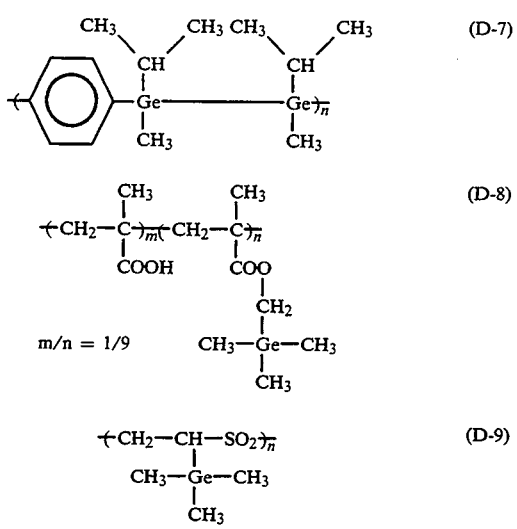

(D-7)

(D-8) m/n = 1/9

(D-9)

In addition, in these EXPERIMENTAL EXAMPLES 4 to 6, an exposure of electron beams was carried out by the use of ELS-3300 made by Elionics KK and then the characteristics of the resist layers were evaluated in the same manner as in the respective EXPERIMENTAL EXAMPLES 1 to 3.

The results are shown in the following Table D2.

TABLE D2

| Item | Experimental Examples | | |
|---|---|---|---|
| | 4 | 5 | 6 |
| Material | D-7 | D-8 | D-9 |
| Sensitivity ($\mu C/cm^2$) | 10 | 7 | 5 |
| Resolution ($\mu m$) | 0.4 | 0.4 | 0.5 |
| $O_2$RIE Etching Rate (nm/min) | 1.0 | 3.5 | 2.5 |

As the results of these EXPERIMENTAL EXAMPLES 4 to 6, the sensitivity ($\mu C\ cm^2$) and the resolution ($\mu m$) are shown together with the $O_2$RIE etching rate (nm/min). Here C designates coulomb.

In addition, OFPR-800 (made by Tokyo Oka KK) was applied to a silicon wafer by the spin coating method and then prebaked for one hour at 200° C. to form the bottom resist layer, followed by forming an upper pattern on the bottom resist layer by the upper resist layer in the same manner as in the above described EXPERIMENTAL EXAMPLES 1 to 6.

Subsequently, a two-layer resist pattern was formed by the oxygen dry etching under the conditions that an oxygen pressure is 1.3 pa, a flow rate being 5 sccm, and an output being 60 W in the RIE apparatus (DEI-451T) made by Nichiden Anelva KK. In every case, the upper pattern by the upper resist layer could be transferred onto the lower bottom resist layer in high accuracy.

Furthermore, the resist pattern formed in each EXPERIMENTAL EXAMPLE was immersed in peroxosulfuric acid or fuming initric acid about 10 minutes as a sample to remove to resist layer. After the immersion, an SEM observation, in short the observation by means of a scanning electron microscope, was carried out with the results that the resist layer could be removed without leaving any leftover in every case.

E. Fifth Preferred Embodiment

In the fifth preferred embodiment, the embodiment relating to methods as set forth in claims 10 to 12 is described.

As set forth in these claims, the resist layer formed on the substrate is made of a resist material generating a group having an active hydrogen by the exposure. And, the resist layer is exposed and then an organic germanium compound containing a group capable of reacting with the active hydrogen is acted upon the exposed resist layer to introduce the organic germanium compound into merely the exposed area.

Subsequently, a pattern of the resist layer is formed by the anisotropic dry etching using an $O_2$ plasma. In addition, when the resist layer is removed, an acid having an oxidizing power is used as a removing liquid.

It is preferable that the resist material generating the group having an active hydrogen by the exposure is selected from the following three resist systems:

(1) The resist system comprising the alkali-soluble organic polymer and the photosensitive dissolution-inhibiting agent.

(2) The resist system comprising the alkali-soluble organic polymer, the photosensitive acid-generating agent and the dissolution-inhibiting agent decomposed by an acid catalyst to form an alkali-soluble group.

(3) The resist system comprising the organic polymer capable of being decomposed by an acid catalyst to form an active hydrogen and the photosensitive acid-generating agent.

Polymers expressed by the following general formulae (E-1) to (E-3) are used as the alkali-soluble organic polymer is the resist system (1).

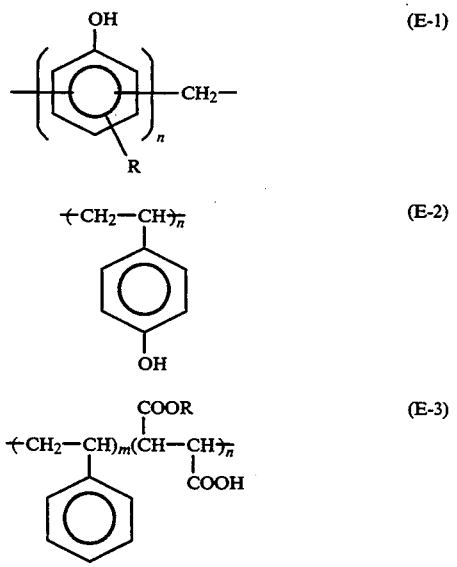

(E-1)

(E-2)

(E-3)

wherein R is an organic group such as an alkyl group having 1 to 6 carbon atoms and the like; m and n are a positive integer.

In addition, the compounds expressed by the following general formulae (E-4) to (E-8) and the like are used as the photosensitive dissolution-inhibiting agent in a quantity of 5 to 30% weight based on the alkali-soluble polymer.

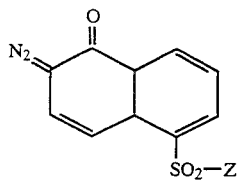 (E-4)

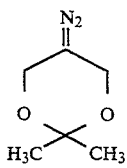 (E-5)

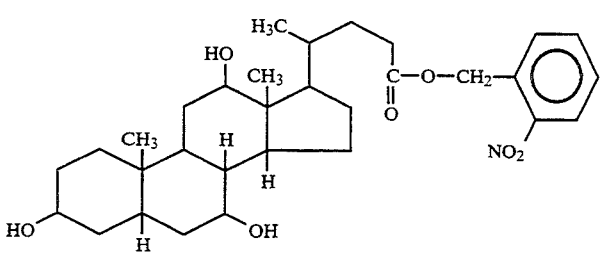 (E-6)

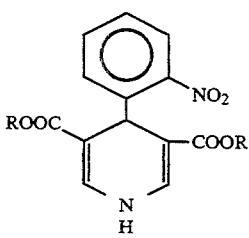 (E-7)

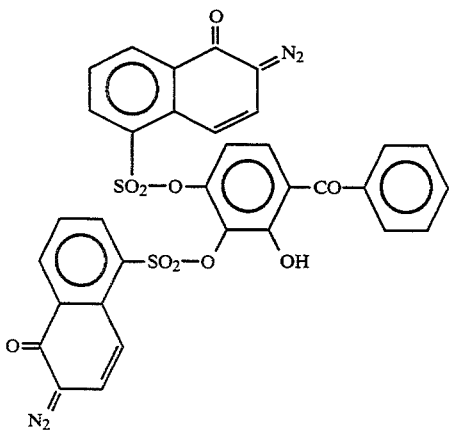 (E-8)

wherein R is an organic group such as an alkyl group having 1 to 6 carbon atoms, a benzen ring, a benzen ring substituting an alkyl group having 1 to 6 carbon atoms, and the like; Z is an organic group Z such as compound having phenolic hydroxyl group before bonding with naphthoquinonediazide, and the like.

A typical resist belonging to this resist system comprises a novolac resin (E-1) and a naphthoquinonediazide compound (E-4).

Also in the resist system (2), the above described alkali-soluble polymer is used and compounds expressed by the following general formulae (E-9) to (E-12) and the like are used as the photosensitive acid-generating agent in a quantity of 0.3 to 5% by weight based on the alkali-soluble polymer.

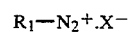 (E-9)

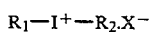 (E-10)

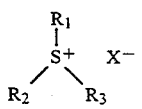 (E-11)

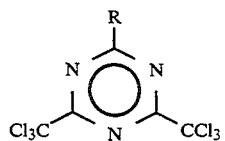 (E-12)

wherein R is an organic group such as an alkyl group having 1 to 6 cabon atoms, a benzen ring, a benzen ring substituting an alkyl group having 1 to 6 carbon atoms, and the like; $R_1$, $R_2$ and $R_3$ are an aromatic organic group such as a benzen ring, a benzen ring substituting an alkyl group having 1 to 6 carbon atoms, a benzen ring substituting an alkoxyl group, and the like; X is one selected from the group consisting of $PF_6-$, $BF_4-$, $SbF_6-$ and $CF_3SO_3-$.

In addition, the compounds expressed by the following general formulae (E-13) to (E-22) and the like are used as the dissolution-inhibiting agent decomposed by an acid catalyst to form the alkali-soluble group in a quantity of 5 to 30% by weight based on the alkali-soluble polymer.

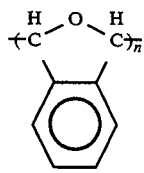  (E-13)

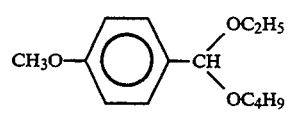  (E-14)

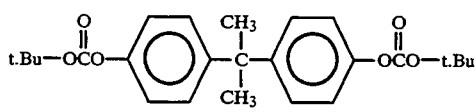  (E-15)

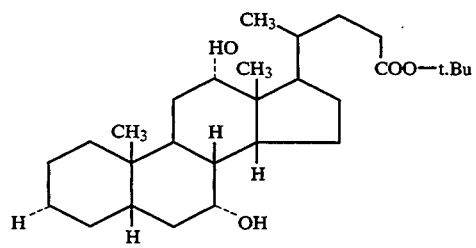  (E-16)

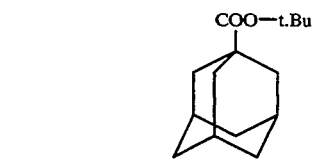  (E-17)

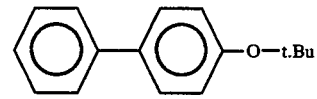  (E-18)

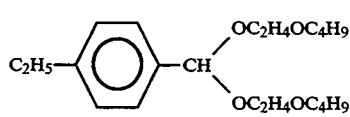  (E-19)

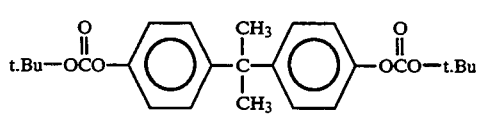  (E-20)

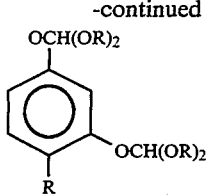  (E-21)

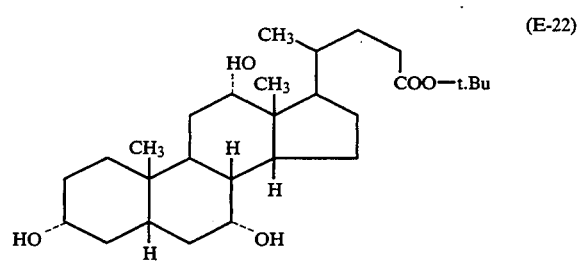  (E-22)

wherein R is an organic group such as an alkyl group having 1 to 6 carbon atoms, a benzen ring, a benzen ring substituting an alkyl group having 1 to 6 carbon atoms, and the like.

In the resist system (3), the polymers expressed by the following general formulae (E-23) to (E-29) and the photosensitive acid-generating agent expressed by the above described general formulae (E-8) to (E-11) can be used in combination.

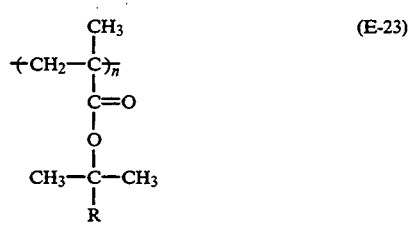  (E-23)

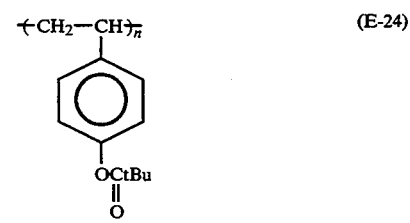  (E-24)

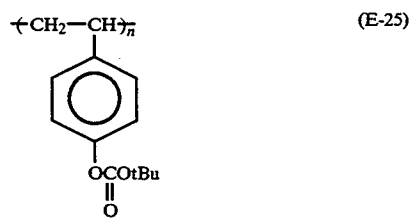  (E-25)

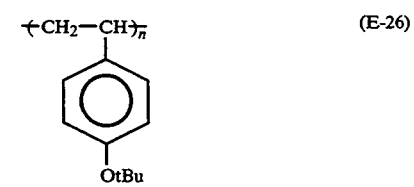  (E-26)

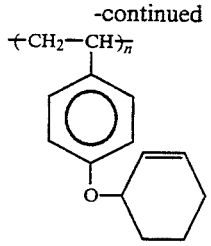
(E-27)

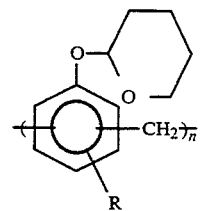
(E-28)

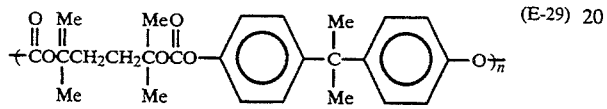
(E-29)

wherein R is an organic group such as an alkyl group having 1 to 6 carbon atoms, a benzen ring, a benzen ring substituting an alkyl group having 1 to 6 carbon atoms, and the like.

These three kinds of resist system (1) to (3) all from a group, such as —OH and —COOH, having an active hydrogen and turn a surface of the reisist layer into a hydrophilic one by the exposure. By bringing into the contact with a vapor of the organic germanium compound containing the group capable of reacting with the active hydrogen after the exposure by the use of such the resist, the organic germanium compound can be introduced into merely the exposed portions. In this time, its speed can be increased by heating.

The componds having structures expressed by the following formulae (E-30) to (E-37) can be used as the organic germanium compound used here.

$(CH_3)_3GeCH_2CH_2OCH\underset{O}{\overset{}{\diagdown\diagup}}CH_2$     (E-30)

$(CH_3)_3GeNHGe(CH_3)_3$     (E-31)

$(CH_3)_3GeO(CH_3)$     (E-32)

$(CH_3)_3GeCl$     (E-33)

$(CH_3)_3GeBr$     (E-34)

$(CH_3)_3Ge(CH_2)_3OCH_2CHCH_2$     (E-35)
$\underset{O}{\overset{}{\diagdown\diagup}}$ $(CH_3)_3Ge(CH_2)_3NCO$     (E-36)

$(CH_3)_3Ge(CH_2)_2COCl$     (E-37)

The resist layer is formed from the material belonging to the above described resist system on the substrate and then organic germanium is introduced into the resist layer under the geseous phase followed by conducting the anisotropic dry etching by the oxygen plasma with the resulting introduced layer as a mask. Thus, the resist pattern can be formed in high accuracy.

In this method of forming the pattern, a GeOx barrier layer is formed in the surface of the resist layer by selectively introducing the exposed portions of the resist layer during the $O_2$ dry etching, so that the superior durability similar to that by the silylation can be obtained. In addition, $GeO_2$ is soluble to usual acids and molten alkalies, so that the resist layer can be easily removed in comparison with the DESIRE process.

An acid having the oxidizing power is used as the removing liquid of the resist layer in the same manner as in the above described first to fourth preferred embodiments.

EXPERIMENTAL EXAMPLES 1 to 3 based on the above described fifth preferred embodiment will be below described.

(E-I) EXPERIMENTAL EXAMPLE 1

A novolac resin/quinonediazide type photoresist (OFPR-800, made by Tokyo Oka KK) was applied to a silicon wafer as a substrate in a thickness of 1 μm by the spin coating method and then exposed with ultraviolet rays by the use of Jet Light made by Oak KK. In this time, the irradiation dose of ultraviolet rays was 50 mJ/cm². After the exposure with ultraviolet rays, a bis(trimethylgermyl)amine vapor was introduced for 10 minutes under the conditions that a pressure is 0.1 Torr and a substrate temperature is 150° C. Subsequently, the dry etching was carried out for 10 minutes in the RIE apparatus (DEM-451T) made by Nichiden Aneruba KK under the conditions that a pressure is 1.3 Pa, a flow rate of $O_2$ being 5 sccm, and a low rate of $CF_4$ being 0.5 sccm. As a result, a negative-type resist pattern having a line and space of 0.5 μm was obtained. After forming the pattern, the substrate was immersed in peroxosulfuric acid and fuming nitric acid, respectively. As a result, the resist layer was perfectly dissolved in both peroxo sulfuric acid and fuming nitric acid and it was confirmed by the SEM observation that no leftover was left.

(E-II) EXPERIMENTAL EXAMPLE 2

A resist layer made of a resist material comprising polyvinyl phenol (having a mean molecular weight of about 5,000 made by Maruzen Oil Co. Ltd.), a photosensitive acid generating agent (0.5% by weight) expressed by the following formula (E-38) and a compound (20% by weight) expressed by the following formula (E-39) was formed in the same manner as in the above described EXPERIMENTAL EXAMPLE 1. Then, the resist layer was exposed with far ultraviolet rays at a dosage of 20 mJ/cm² by the use of Maskaligner PLA-521 (light source: Xe—Hg lamp) made by a Canon inc. to be prebaked for 2 minutes at 100° C.

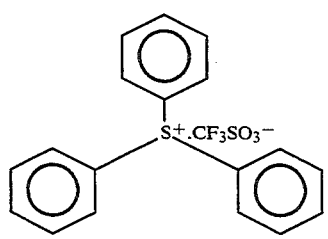
(E-38)

-continued

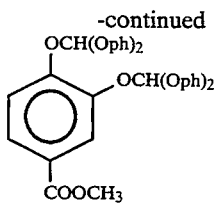
(E-39)

Subsequently, methoxytrimethylgermane vapor was reacted with the resist layer for 15 minutes under the conditions that a substrate temperature was 60° C. and a pressure was 0.1 Torr and then subjected to the dry etching under the same conditions as in EXPERIMENTAL EXAMPLE 1.

As a result, a negative-type resist pattern having a line and space of 0.5 μm could be formed. After forming the pattern, the substrate was immersed in a mixture solution of concetrated sulfuric acid and 30%-hydrogen peroxide (2/1).

As a result, the resist layer was perfectly dissolved.

(E-III) EXPERIMENTAL EXAMPLE 3

A resist comprising a polymer expressed by the following formula (E-40) and a compound (2% by weight) expressed by the following of formula (E-41) was evaluated in the same manner as in EXPERIMENTAL EXAMPLE 2. In this case, an organic germanium compound expressed by the following formula (E-42) was used and the dry etching was carried out under the conditions that a pressure was 1.3 pa and a flow rate of oxygen was 5 sccm. As a result, the same results as in EXPERIMENTAL EXAMPLE 2 were obtained.

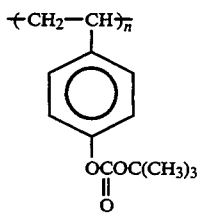
(E-40)

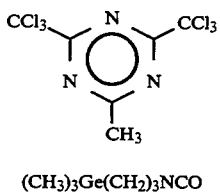
(E-41)

(CH₃)₃Ge(CH₂)₃NCO  (E-42)

F. Sixth Preferred Embodiment

In the sixth preferred embodiment, EXAMPLES relating to methods as set forth in claims 10, 11 and 13 is described.

As set forth in these claims, a resist layer formed on a substrate is composed of the photosensitive acid-generating agent capable of generating an acid when exposed with high-energy beams and the organic polymer. And, the resist layer is exposed and then an organic germanium compound containing a cationic polymerizable group is introduced into merely the exposed portions to form a resist pattern.

In addition, in order to remove the resist layer, an acid having an oxidizing power is used in the same manner as in the above described first to fifth preferred embodiments.

The photosensitive acid-generating agent includes sulfonium salts expressed by the following general formula (F-1), iodonium salts expressed by the following general formula (F-2), chlorine compounds expressed by the following general formula (F-3) and the like.

(F-1)

(F-2)

(F-3)

wherein R is an organic group such as an alkyl group having 1 to 6 carbon atoms, a benzen ring, a benzen ring substituting an alkyl group having 1 to 6 carbon atoms, and the like; $R_1$, $R_2$ and $R_3$ are aromatic organic groups such as a benzen ring, a benzen ring substituting alkyl group having 1 to 6 carbon atoms, a benzen ring substituting alkoxyl group, and the like; Z is any one selected from the group consisting of $CF_3SO_3^-$, $CH_3$—$C_6H_4$—$SO_3^-$, $ClO_4^-$, $BF_4^-$, $PF_6^-$, $SbF_6^-$ and $AsF_6^-$.

In addition, the organic polymer is not specially limited. Every one compatible with the above described photosensitive acid-generating agent can be used. Polyvinyl phenol, novolac resin, polystyrene, polymethyl methacrylate and the like can be used as the organic polymer.

Every organic germanium compound having at least one cationic polymerizable group, such as epoxy group, vinyl ether group and styryl group, in a molecule is used as the above described organic germanium compound containing the cationic polymerizable group. For example, compounds expressed by the following genreal formulae (F-4) to (F-7) are used.

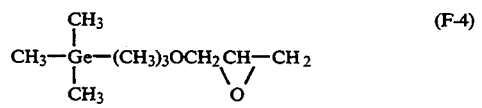
(F-4)

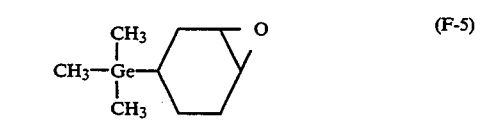
(F-5)

(F-6)

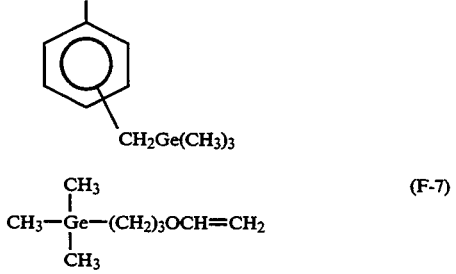
(F-7)

A method of selectively surface polymerizing merely the exposed portions of the resist layer includes a method in which a vapor of the above desired compounds is introduced into the exposed portions under normal pressure or reduced pressure. In this time, a suitable treating time is several minutes to scores of minutes. In addition, the treating time can be shortened by heating.

EXPERIMENTAL EXAMPLES 1 to 9 based on the above described sixth preferred embodiment will be below described.

(F-I) EXPERIMENTAL EXAMPLES 1 to 6

The photosensitive acid-generating agents expressed by the above described general formulae (F-1), (F-2) and (F-3) were added to polyvinyl phenol (made by Maruzen Oil and Chemicals Co. Ltd.) as the organic polymer in a quantity of 10% by weight to form photosensitive compositions. Then the resulting photosensitive composition was applied to a silicon wafer as a substrate in a thickness of 1 μm to form a resist layer.

The resist layer was selectively exposed in Mask-aligner PLA-521 (made by Canon Inc.) by the use of a Xe—Hg lamp as a light source, a cold mirror and LM 250. Then, a vapor of an organic germanium expressed by the following formula (F-8) was flown over the wafer kept at 60° C. under reduced pressure for 5 minutes or 20 minutes.

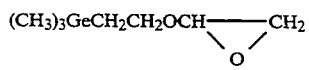

(F-8)

Subsequentyly, the wafer was etched in the RIE apparatus (made by Nichiden Anelva KK) under the conditions that an oxygen pressure was 13 pa and an electric power was 60 W until nonexposed portions of the resist layer was perfectly removed.

At this time, a dosage, at which a thickness of the remaining resist layer on the exposed portions arrived at ½ times the initial layer-thickness, was adopted as a sensitivity. The resolution was determined from a minimum pattern size which could be resolved by a line and space pattern. The sensitivity and resolution are shown in the following Table F1.

TABLE F1

| Item | Experimental Examples | | | | | |
|---|---|---|---|---|---|---|
| | 1 | 2 | 3 | 4 | 5 | 6 |
| Photosensitive Acid-generating | F-1 | F-1 | F-2 | F-2 | F-3 | F-3 |

TABLE F1-continued

| Item | Experimental Examples | | | | | |
|---|---|---|---|---|---|---|
| | 1 | 2 | 3 | 4 | 5 | 6 |
| Agent | | | | | | |
| Treating time (min) | 5 | 20 | 5 | 20 | 5 | 20 |
| Sensitivity (mJ/cm²) | 70 | 30 | 80 | 40 | 100 | 50 |
| Resolution (μm) | 0.5 | 0.5 | 0.5 | 0.5 | 0.5 | 0.5 |

Photosensitive acid-generating agents expressed by the following formula (F-9), (F-10) and (F-11) were added to polymethyl methacrylate (Mw ≈ 100,000) as the organic polymer is a quantity of 15% by weight, respectively, to form photosensitive resin compositions.

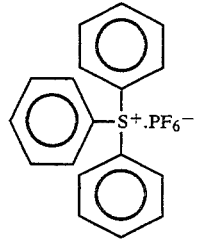

(F-9)

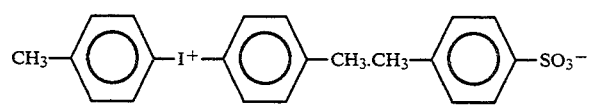

(F-10)

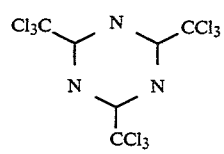

(F-11)

Then, the exposure was carried out in the same manner as in the above described EXPERIMENTAL EXAMPLES 1 to 6 and then the above described organic germanium compound (F-6) and the wafer were put in a tightly closed vessel to be kept for 10 minutes at normal pressure and 60° C. Subsequently, the treatment and evaluation were carried out in the same manner as in the above described EXPERIMENTAL EXAMPLES 1 to 6. The results are shown in the following Table F2.

TABLE F2

| Item | Experimental Examples | | |
|---|---|---|---|
| | 7 | 8 | 9 |
| Photosensitive Acid-generating Agent | F-9 | F-10 | F-11 |
| Sensitivity (mJ/cm²) | 40 | 50 | 75 |
| Resolution (μm) | 0.5 | 0.5 | 0.5 |

Then, the resist patterns formed in the above described EXPERIMENTAL EXAMPLES 2 and 7 were etched in a plasma ashig apparatus for 20 minutes with the result that a leftover was observed on the wafers. These wafers were immersed in peroxo sulfuric acid for 1 minute with the result that no leftover was observed on the wafers.

In addition, the resist patterns formed in EXPERIMENTAL EXAMPLES 4 and 8 were immersed peroxosulfuric acid for 1 minute, washed and dried followed by etching in a plasma ashing apparatus for 15 minutes. At this time, no leftover was observed on the wafers.

Although the present invention has been described in detail, it is clearly understood that the same is by way of example only and is not to be taken by way of limitation. The spirit and scope of the present invention should be limited only by the terms of the appended claims.

We claim:

1. A method of forming and removing a resist pattern, comprising
   forming a bottom resist layer on a substrate,
   selectively forming an upper resist layer containing germanium on said bottom resist layer,
   etching the bottom resist layer by an anisotropic oxygen etching using said upper resist layer as a mask to form a resist pattern, and
   removing said upper resist layer with an acid having an oxidizing power, wherein the acid is peroxosulfuric acid or fuming nitric acid.

2. A method of forming and removing a resist pattern in accordance with claim 1, wherein said upper resist layer is formed of a negative resist comprising an alkali-soluble organic germanium polymer and a bisazide compound.

3. A method of forming and removing a resist pattern in accordance with claim 1, wherein said upper resist layer is formed of a negative resist comprising an organic germanium polymer having a polymerizable group in a molecule and a polymerization initiator.

4. A method of forming and removing a resist pattern in accordance with claim 1, wherein said upper resist layer is formed of a positive resist comprising an alkali-soluble organic germanium polymer and a photosensitive dissolution-inhibiting agent.

5. A method of forming and removing a resist pattern in accordance with claim 1 wherein said upper resist layer is formed of a positive resist comprising an alkali-soluble organic germanium compound, an alkali-soluble organic polymer and a photosensitive dissolution-inhibiting agent.

6. A method of forming and removing a resist pattern in accordance with claim 1, wherein said upper resist layer is formed of a positive resist comprising an alkali-soluble organic germanium polymer, a dissolution-inhibiting agent which is decomposed by an acid catalyst to change alkali-soluble and a photosensitive acid-generating agent.

7. A method of forming and removing a resist pattern in accordance with claim 1, wherein said upper resist layer is formed of a positive resist comprising an organic germanium polymer which is decomposed by an acid catalyst to change alkali-soluble and a photosensitive acid-generating agent.

8. A method of forming and removing a resist pattern in accordance with claim 1, wherein said upper resist layer is formed of a positive resist comprising a germanium-containing main chain decomposition-type compound.

9. A method of forming and removing a resist pattern in accordance with claim 1, wherein the bottom resist layer comprises novolac resin and naphthoquinone diazide.

* * * * *